United States Patent
Maeta

(10) Patent No.: US 10,707,301 B2
(45) Date of Patent: Jul. 7, 2020

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Ryo Maeta, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 41 days.

(21) Appl. No.: 15/993,305

(22) Filed: May 30, 2018

(65) Prior Publication Data

US 2019/0027555 A1    Jan. 24, 2019

(30) Foreign Application Priority Data

Jul. 18, 2017   (JP) ................. 2017-139492

(51) Int. Cl.
  *H01L 29/06* (2006.01)
  *H01L 21/761* (2006.01)
  *H01L 29/66* (2006.01)
  *H01L 29/78* (2006.01)

(52) U.S. Cl.
  CPC ........ *H01L 29/0634* (2013.01); *H01L 21/761* (2013.01); *H01L 29/66712* (2013.01); *H01L 29/66734* (2013.01); *H01L 29/7802* (2013.01); *H01L 29/7811* (2013.01); *H01L 29/7813* (2013.01); *H01L 29/0638* (2013.01)

(58) Field of Classification Search
  None
  See application file for complete search history.

(56) References Cited

U.S. PATENT DOCUMENTS

| | | |
|---|---|---|
| 2001/0028083 A1 | 10/2001 | Onishi et al. |
| 2002/0167020 A1 | 11/2002 | Iwamoto et al. |
| 2004/0065921 A1 | 4/2004 | Iwamoto et al. |
| 2004/0124465 A1 | 7/2004 | Onishi et al. |
| 2005/0017292 A1 | 1/2005 | Onishi et al. |

(Continued)

FOREIGN PATENT DOCUMENTS

| | | |
|---|---|---|
| JP | 2001-298190 A | 10/2001 |
| JP | 2008-004643 A | 1/2008 |

*Primary Examiner* — Shaun M Campbell
*Assistant Examiner* — Aneta B Cieslewicz
(74) *Attorney, Agent, or Firm* — Rabin & Berdo, P.C.

(57) ABSTRACT

A semiconductor device has a termination structure region that includes a lower parallel pn structure having lower first-columns of a first conductivity type and lower second-columns of a second conductivity type; a center parallel pn structure having center first-columns of the first conductivity type and first rings of the second conductivity type; an upper parallel pn structure having upper first-columns of the first conductivity type and upper second-columns of the second conductivity type; and an uppermost parallel pn structure having uppermost first-columns of the first conductivity type and second rings of the second conductivity type. The first and second rings are wider than the lower second-columns. An interval between the first rings and between the second rings is wider than an interval between the lower second-columns. Positions of the first rings differ from positions of the second rings, along a direction parallel to a front surface of the semiconductor device.

6 Claims, 12 Drawing Sheets

(56) References Cited

U.S. PATENT DOCUMENTS

2007/0272979 A1* 11/2007 Saito .................. H01L 29/0634
 257/335
2010/0200936 A1 8/2010 Saito et al.

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-139492, filed on Jul. 18, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

In an ordinary n-type channel, vertical metal oxide semiconductor field effect transistor (MOSFET), among plural semiconductor layers formed on a semiconductor substrate, an n-type conductive layer (drift layer) is the semiconductor layer having a highest resistance. Electrical resistance of this n-type drift layer significantly affects ON resistance of the vertical MOSFET overall. Reduction of the ON resistance of the vertical MOSFET overall may be realized by reducing a thickness of the n-type drift layer and shortening a current path.

The vertical MOSFET has a further function of sustaining a breakdown voltage by a spreading of a depletion layer to the high-resistance n-type drift layer in an OFF state. Therefore, when the n-type drift layer is made thinner to reduce the ON resistance, the spread of the depletion layer in the OFF state becomes shorter, whereby critical electric field strength tends to be reached by a low applied voltage and the breakdown voltage decreases. Meanwhile, to increase the breakdown voltage of the vertical MOSFET, the thickness of the n-type drift layer has to be increased, whereby the ON resistance increases. Such a relationship between the ON resistance and the breakdown voltage is called a tradeoff relationship and concurrent enhancement of both members of such a tradeoff relationship is generally difficult. The tradeoff relationship of the ON resistance and the breakdown voltage is known to similarly occur in other semiconductor devices like insulated gate bipolar transistors (IGBTs), bipolar transistors, diodes, etc. A superjunction (SJ) structure is known as a semiconductor device structure that addresses this problem. For example, a MOSFET (hereinafter, SJ-MOSFET) having a superjunction structure is known. FIG. 18 is a cross-sectional view of a structure of a conventional SJ-MOSFET at cutting line A-A' in FIG. 19. FIG. 19 is a top view of the structure of the conventional SJ-MOSFET. FIG. 19 is a top view as viewed from a top (source electrode 1010 side) in a state without an oxide film 1013 depicted in FIG. 18.

As depicted in FIG. 18, SJ-MOSFET uses as a material, a wafer in which an n⁻-type drift layer 102 is grown on an n⁺-type semiconductor substrate 101 having a high impurity concentration. A p-type column region 104 is provided from a surface of the wafer. The p-type column region 104 penetrates the n⁻-type drift layer 102 and does not reach the n⁺-type semiconductor substrate 101. In FIG. 18, although the p-type column region 104 does not reach the n⁺-type semiconductor substrate 101, the p-type column region 104 may reach the n⁺-type semiconductor substrate 101.

Further, the SJ-MOSFET has in the n⁻-type drift layer 102, a parallel structure (hereinafter, parallel pn region 1019) in which a p-type region (the p-type column region 104) extending along a direction orthogonal to a substrate main surface and having a narrow width in a plane parallel to the substrate main surface, and an n-type region (a portion of the n⁻-type drift layer 102 sandwiched by the p-type column region 104, hereinafter, n-type column region 103) are arranged to alternate repeatedly in a plane parallel to the substrate main surface. The p-type column regions 104 and the n-type column regions 103 constituting the parallel pn region 1019 are regions of increased impurity concentrations according to the n⁻-type drift layer 102. In the parallel pn region 1019, impurity concentrations of the p-type column regions 104 and the n-type column regions 103 are substantially equal, enabling in the OFF state, a pseudo non-doped layer to be created, facilitating a high breakdown voltage.

A p⁺-type base region 105 is provided on the parallel pn region 1019 of an active region 1200 of the SJ-MOSFET, the active region 1200 being a region in which an element is formed and through which current flows during an ON state. An n⁺-type source region 106 is provided in the p⁺-type base region 105. Further, a gate insulating film 107 is provided across surfaces of the p⁺-type base region 105 and the n-type column region 103. A gate electrode 108 is provided on a surface of the gate insulating film 107, and an interlayer insulating film 9 is provided so as to cover the gate electrode 108. Further, the source electrode 1010 is provided on the n⁺-type source region 106, and a drain electrode (not depicted) is provided on a rear surface of the n⁺-type semiconductor substrate 101.

As depicted in FIGS. 18 and 19, in a termination region 1300 of the SJ-MOSFET, the termination region 1300 surrounding the active region 1200, an n⁺-type region 1012 functioning as a channel stopper is formed in the n⁻-type drift layer 102. The oxide film 1013 is provided on the n⁻-type drift layer 102 and is provided on a parallel pn region 1020 and the n⁺-type region 1012. The drain electrode (not depicted) is provided on the rear surface of the n⁺-type semiconductor substrate 101.

Further, in a power semiconductor element, the termination region 1300 has to sustain a breakdown voltage similarly to the active region 1200. To obtain high breakdown voltage in the termination region 1300, a structure in which a field plate, RESURF, guard ring, etc. is formed is a commonly known art. According to a related art, in an element having a parallel pn region, a pitch of the parallel pn region 1020 in the termination region 1300 is narrower than a pitch of the parallel pn region 1019 in the active region 1200 (for example, refer to Japanese Laid-Open Patent Publication No. 2001-298190). Here, a pitch is a width W that is a sum of a width of the p-type column region 104 and a width of the n-type column region 103 adjacent thereto of the parallel pn region 1019, the pitch also being called a repeat pitch. With such a configuration, an impurity concentration of the termination region 1300 becomes lower than an impurity concentration of the active region 1200, enabling the breakdown voltage of the termination region 1300 to be enhanced.

Further, according to a related art, in an element having a parallel pn region, at a surface of a high-resistance layer in which the parallel pn region of a termination region is not provided, a guard ring layer and an embedded guard ring layer is embedded so as to cover and be in contact with the guard ring layer and a corner part on an outer side of the guard ring layer (for example, refer to Japanese Laid-Open Patent Publication No. 2008-4643). With such a configuration, the embedded guard ring layer is depleted, enabling a gradual electric field distribution.

SUMMARY OF THE INVENTION

According to an embodiment of the present invention, a semiconductor device includes an active region through which current flows; and a termination structure region arranged outside the active region, the termination structure region having formed therein a breakdown voltage structure surrounding a periphery of the active region. The termination structure region has: a first semiconductor layer of a first conductivity type provided on a front surface of a semiconductor substrate of the first conductivity type, the first semiconductor layer having an impurity concentration that is lower than an impurity concentration of the semiconductor substrate, and a parallel pn structure provided at a surface of the first semiconductor layer. The parallel pn structure includes: a lower parallel pn structure provided at the surface of the first semiconductor layer, the lower parallel pn structure having in a plane parallel to the front surface, lower first columns of the first conductivity type and lower second columns of a second conductivity type, the lower first columns being arranged to alternate repeatedly with the lower second columns; a center parallel pn structure provided on an upper surface of the lower parallel pn structure, the center parallel pn structure having in a plane parallel to the front surface, center first columns of the first conductivity type and first rings of the second conductivity type surrounding the active region, the center first columns being arranged to alternate repeatedly with the first rings; an upper parallel pn structure provided on an upper surface of the center parallel pn structure, the upper parallel pn structure having in a plane parallel to the front surface, upper first columns of the first conductivity type and upper second columns of the second conductivity type, the upper first columns being arranged to alternate repeatedly with the upper second columns; and an uppermost parallel pn structure provided on an upper surface of the upper parallel pn structure, the uppermost parallel pn structure having in a plane parallel to the front surface, uppermost first columns of the first conductivity type and second rings of the second conductivity type surrounding the active region, the uppermost first columns being arranged to alternate repeatedly with the second rings. The first rings and the second rings have a width that is wider than a width of the lower second columns. An interval between the first rings and an interval between the second rings are wider than an interval between the lower second columns. The first rings are provided at positions different from positions of the second rings, along a direction parallel to the front surface.

In the embodiment, the lower first column, the center first column, the upper first column, and the uppermost first column are electrically connected.

In the embodiment, the termination structure region includes: a first semiconductor region of the first conductivity type surrounding an outside of the parallel pn structure; and a second semiconductor region of the first conductivity type surrounding an outside of the first semiconductor region. The lower parallel pn structure, the center parallel pn structure, the upper parallel pn structure and the uppermost parallel pn structure of the parallel pn structure have a same width. In the termination structure region, a ratio of a width of the parallel pn structure and a width of the first semiconductor region is 0.2 to 0.8.

In the embodiment, a width of the first rings and a width of the second rings are 1.3 to 2 times a width of the upper second columns and a width of the lower second columns. The interval between the first rings and the interval between the second rings are 1.5 to 2 times the interval between the lower second columns or an interval between the upper second columns.

According to another embodiment of the present invention, a method of manufacturing a semiconductor device having an active region through which current flows; and a termination structure region arranged outside the active region, the termination structure region having formed therein a breakdown voltage structure surrounding a periphery of the active region, includes forming a first semiconductor layer of a first conductivity type on a front surface of a semiconductor substrate of the first conductivity type, the first semiconductor layer having an impurity concentration that is lower than an impurity concentration of the semiconductor substrate; forming a lower parallel pn structure at a surface of the first semiconductor layer, the lower parallel pn structure having in a plane parallel to the front surface, lower first columns of the first conductivity type and lower second columns of a second conductivity type, the lower first columns being arranged to alternate repeatedly with the lower second columns; forming a center parallel pn structure on a surface of the lower parallel pn structure, the center parallel pn structure having in a plane parallel to the front surface, center first columns of the first conductivity type and first rings of the second conductivity type surrounding the active region, the center first columns being arranged to alternate repeatedly with the first rings; forming an upper parallel pn structure on an upper surface of the center parallel pn structure, the upper parallel pn structure having in a plane parallel to the front surface, upper first columns of the first conductivity type and upper second columns of the second conductivity type, the upper first columns being arranged to alternate repeatedly with the upper second columns; and forming an uppermost parallel pn structure on an upper surface of the upper parallel pn structure, the uppermost parallel pn structure having in a plane parallel to the front surface, uppermost first columns of the first conductivity type and second rings of the second conductivity type surrounding the active region, the uppermost first columns being arranged to alternate repeatedly with the second rings. Forming the center parallel pn structure includes forming the first rings to have a width wider than a width of the lower second columns, and forming an interval between the first rings to be wider than an interval between the lower second columns. Forming the uppermost parallel pn structure includes forming the second rings to have a width equal to the width of the first rings, forming an interval between the second rings to be equal to the interval between the first rings, and forming the second rings at positions different from positions of the first rings, along a direction parallel to the front surface.

In the embodiment, forming the center parallel pn structure and forming the uppermost parallel pn structure includes using a mask having an opening of a width that is 1 to 1.2 times a width of an opening of a mask used in forming the lower parallel pn structure and the upper parallel pn structure.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
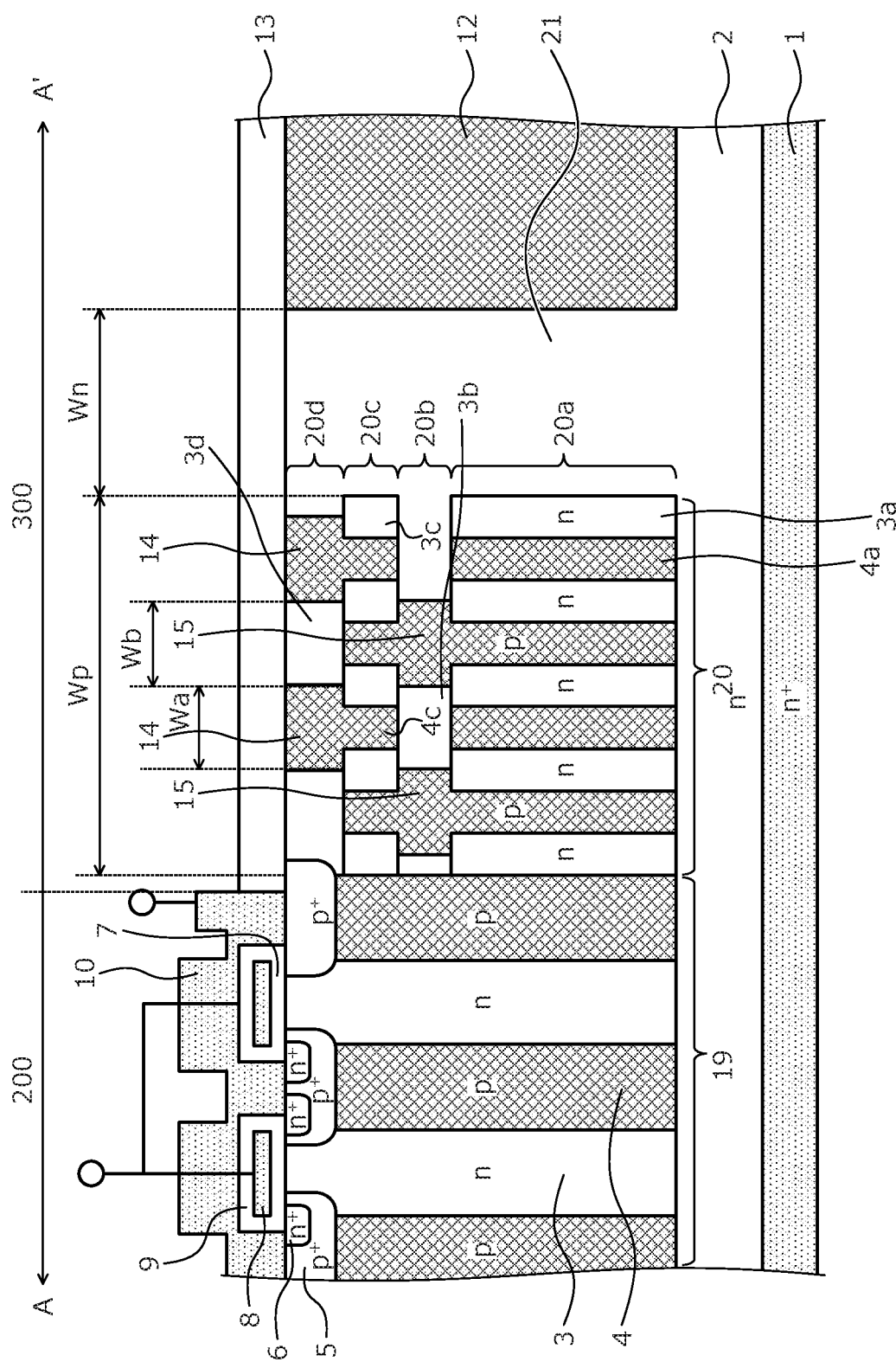
FIG. 1 is a cross-sectional view of a structure of a SJ-MOSFET according to an embodiment, at cutting line A-A' in FIG. 2.

First, problems associated with the related arts will be described. In the structure described in Japanese Laid-Open Patent Publication No. 2001-298190, a depletion layer spreads easily in a lateral direction (toward the $n^+$-type region 1012) from the active region 1200 and does not spread easily in a longitudinal direction (toward the $n^+$-type semiconductor substrate 101). Thus, equipotential lines are densely distributed in the lateral direction, while equipotential lines are spread out in the longitudinal direction as compared to in the lateral direction, whereby the breakdown voltage sustained in the longitudinal direction is reduced and the breakdown voltage of the termination region 1300 decreases. Therefore, to meet a target breakdown voltage, a need to increase a length of the termination region 1300 arises.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 2:
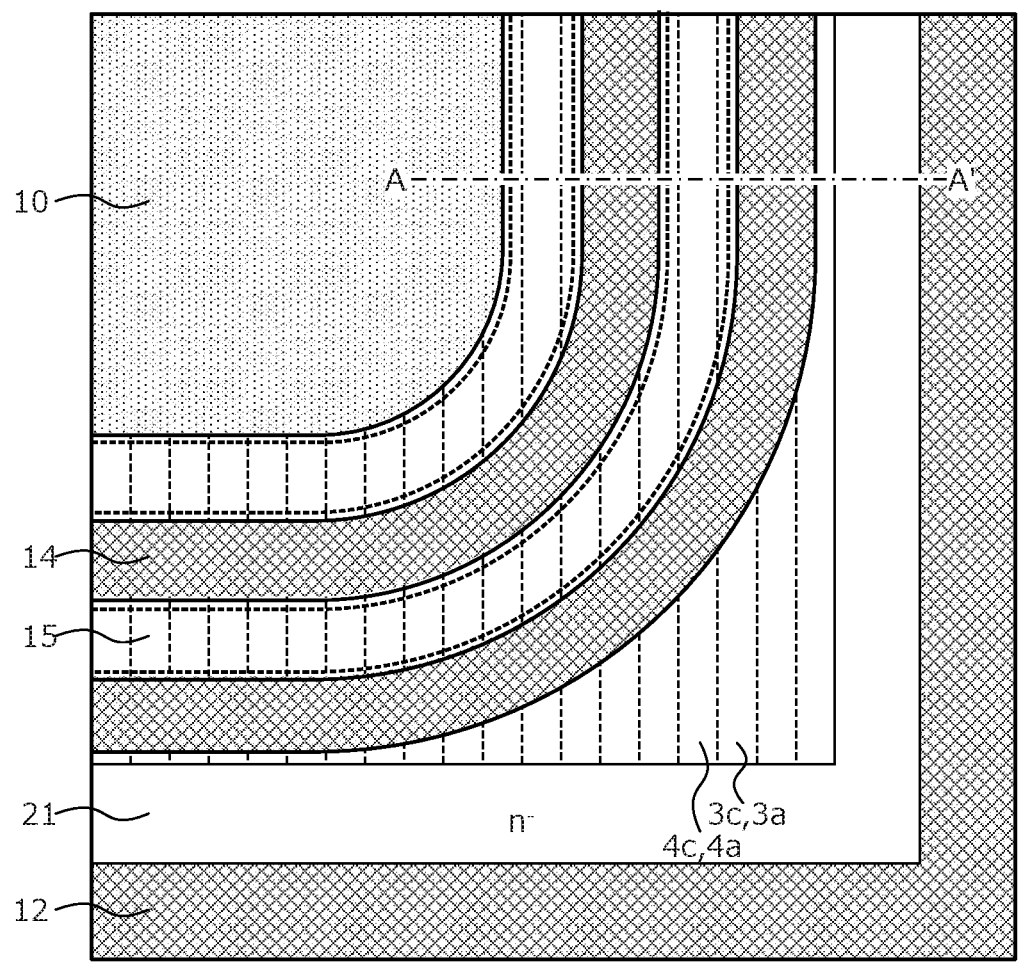
FIG. 2 is a top view of the structure of the SJ-MOSFET according to the embodiment.

The semiconductor device according to an embodiment of the present invention will be described taking a SJ-MOSFET as an example. FIG. 1 is a cross-sectional view of a structure of the SJ-MOSFET according to the embodiment, at cutting line A-A' in FIG. 2. FIG. 2 is a top view of the structure of the SJ-MOSFET according to the embodiment. FIG. 2 is a top view as viewed from a top (source electrode 10 side) in a state in which an oxide film 13 depicted in FIG. 1 is not present.

The SJ-MOSFET depicted in FIG. 1 is a SJ-MOSFET having a metal oxide semiconductor (MOS) gate in an upper portion (portion including at least a front surface and a $p^+$-type base region 5) of a semiconductor base (silicon base: semiconductor chip) containing silicon (Si). The SJ-MOSFET has an active region 200 and a termination region 300 that surrounds a periphery of the active region 200. The active region 200 is a region in which current flows during an ON state. The termination region 300 is a region that mitigates electric field of a base front surface side of a drift region. In FIG. 1, in the active region 200, only two unit cells (functional units of an element) are depicted and unit cells adjacent to the two unit cells are not depicted. A boundary of the active region 200 and the termination region 300 is a terminus face of the source electrode 10.

An $n^+$-type semiconductor substrate (semiconductor substrate of a first conductivity type) 1 is a single crystal silicon substrate doped with, for example, phosphorus (P). An $n^-$-type drift layer (first semiconductor layer of the first conductivity type) 2 is a low-concentration $n^-$-type drift layer that has an impurity concentration lower than an impurity concentration of the $n^+$-type semiconductor substrate 1 and that is doped with, for example, phosphorus. Hereinafter, the $n^+$-type semiconductor substrate 1 and the $n^-$-type drift layer 2 collectively are regarded as the semiconductor base. In the upper portion of the semiconductor base, the MOS gate (insulated gate using a metal-oxide film-semiconductor material) structure (element structure) is formed. Further, at a rear surface of the semiconductor base, a drain electrode (not depicted) is provided.

In the active region 200 of the SJ-MOSFET, a parallel pn region 19 is provided. In the parallel pn region 19, an n-type column region 3 and a p-type column region 4 are arranged to alternate repeatedly. The p-type column region 4 is provided from a surface of the $n^-$-type drift layer 2 and does not reach a surface of the $n^+$-type semiconductor substrate 1. A planar shape of the n-type column regions 3 and the p-type column regions 4 is, for example, a striped shape. Cutting line A-A' depicted in FIG. 2 represents a cross-section of the n-type column regions 3 and the p-type column regions 4, orthogonal to a length direction. Further, the $p^+$-type base region 5 is provided in a surface layer of the p-type column region 4 and an $n^+$-type source region 6 is provided in a surface layer of the $p^+$-type base region 5. On a surface of a portion of the $p^+$-type base region 5 between the $n^+$-type source region 6 and the n-type column region 3, a gate electrode 8 is provided via a gate insulating film 7. The gate electrode 8 may be provided on a surface of the n-type column region 3 via the gate insulating film 7.

An interlayer insulating film 9 is provided at a front surface side of the semiconductor base so as to cover the gate electrode 8. The source electrode 10 is in contact with the $n^+$-type source region 6 and the $p^+$-type base region 5 via a contact hole opened in the interlayer insulating film 9, and is electrically connected to the $n^+$-type source region 6 and the $p^+$-type base region 5.

The source electrode 10 is electrically insulated from the gate electrode 8 by the interlayer insulating film 9. A protective film (not depicted) such as a passivation film containing, for example, polyimide is selectively provided on the source electrode 10.

In the termination region 300 of the SJ-MOSFET, a parallel pn region 20 is selectively provided. Outside the parallel pn region 20, an $n^-$-type layer 21 (first semiconductor region of the first conductivity type) having an impurity concentration lower than an impurity concentration of the $n^-$-type drift layer 2 is provided so as to surround the parallel pn region 20. Outside the $n^-$-type layer 21, an $n^+$-type region (second semiconductor region of the first conductivity type) 12 functioning as a channel stopper is provided so as to surround the $n^-$-type layer 21. The oxide film 13 is provided on surfaces of the parallel pn region 20, the $n^-$-type layer 21, and the $n^+$-type region 12. The impurity concentration of the $n^-$-type layer 21 may be equal to the impurity concentration of the $n^-$-type drift layer 2. In a portion of the parallel pn region 20 of the termination region 300, an uppermost p-type layer ring 14 and an intermediate p-type layer ring 15 are provided. A repeat pitch (sum of width of a p-type layer ring and width of an n-type column region) of the uppermost p-type layer ring 14 and an uppermost n-type column region 3d, and a repeat pitch of the intermediate p-type layer ring 15 and an intermediate n-type column region 3b are larger than other layers; and in particular, are as follows. The parallel pn region 20 of the termination region 300 is constituted by (in order stated from a surface of the $n^-$-type drift layer 2, a lower parallel pn region 20a, a center parallel pn region 20b, an upper parallel pn region 20c, and an uppermost parallel pn region 20d. In the lower parallel pn region 20a, a lower n-type column region 3a and a lower p-type column region 4a are arranged to alternate repeatedly in a plane parallel to the $n^+$-type semiconductor substrate 1. In the center parallel pn region 20b, the intermediate n-type column region 3b and the intermediate p-type layer ring 15 are arranged to alternate repeatedly in a plane parallel to the $n^+$-type semiconductor substrate 1. In the upper parallel pn region 20c, an upper n-type column region 3c and an upper p-type column region 4c are arranged to alternate repeatedly in a plane parallel to the $n^+$-type semiconductor substrate 1. In the uppermost parallel pn region 20d, the uppermost n-type column region 3d and the uppermost p-type layer ring 14 are arranged to alternately repeat in a plane parallel to the $n^+$-type semiconductor substrate 1. Further, the lower parallel pn region 20a, the center parallel pn region 20b, the upper parallel pn region 20c, and the uppermost parallel pn region 20d have a same width. Hereinafter, the parallel pn region 20 of the termination region 300 will be referred to as the parallel pn region 20.

Here, the uppermost p-type layer ring 14 and the intermediate p-type layer ring 15 are rings provided so as to surround the active region 200 and a width Wa thereof is wider than respective widths of the lower p-type column region 4a and the upper p-type column region 4c. In particular, the width Wa is from 1.3 times to 2.0 times the respective widths of the lower p-type column region 4a and the upper p-type column region 4c. Further, an interval between the uppermost p-type layer rings 14 and an interval between the intermediate p-type layer rings 15 (correspond to a width of the uppermost n-type column region 3d and a width of the intermediate n-type column region 3b, respectively) are wider than an interval between the lower p-type column regions 4a and an interval between the upper p-type column regions 4c (correspond to the width of the lower n-type column region 3a and the width of the upper n-type column region 3c, respectively). In particular, an interval Wb between rings is from 1.3 to 2.0 times the interval between the lower p-type column regions 4a, and the interval between the upper p-type column regions 4c.

Therefore, the lower parallel pn region 20a and the upper parallel pn region 20c have a same repeat pitch (sum of width of an n-type column region and width of a p-type column region) of the n-type column region and the p-type column region, while the center parallel pn region 20b and the uppermost parallel pn region 20d have a same repeat pitch of the n-type column region and the p-type layer ring. Further, the center parallel pn region 20b and the uppermost parallel pn region 20d have a repeat pitch wider than a repeat pitch of the lower parallel pn region 20a and the upper parallel pn region 20c, more specifically, 1.5 to 2.0 times wider. Further, the interval between the n-type column regions and the interval between the p-type layer rings in the center parallel pn region 20b and the uppermost parallel pn region 20d are 1.5 to 2.0 times the interval between the n-type column regions and the interval between the p-type column regions in the lower parallel pn region 20a and the upper parallel pn region 20c.

Further, the lower n-type column region 3a and the lower p-type column region 4a have a same width, while the upper n-type column region 3c and the upper p-type column region 4c have a same width. Further, the lower n-type column region 3a and the upper n-type column region 3c have a same width and therefore, the lower p-type column region 4a and the upper p-type column region 4c have a same width. A planar shape of the lower n-type column region 3a and the upper n-type column region 3c, and a planar shape of the lower p-type column region 4a and the upper p-type column region 4c planar shape are, for example, a striped shape. Arrangement is such that a length direction of the n-type column regions 3 of the parallel pn region 19 and the p-type column regions 4 of the parallel pn region 20 becomes parallel to a length direction of the lower n-type column regions 3a and the upper n-type column regions 3c (hereinafter, n-type column regions of the parallel pn region 20) and the lower p-type column regions 4a and the upper p-type column regions 4c (hereinafter, p-type column regions of the parallel pn region 20) of the parallel pn region 19.

The respective widths of the lower n-type column region 3a, the upper n-type column region 3c, the lower p-type column region 4a and the upper p-type column region 4c may be from 3 μm to 5 μm and, for example, are 4 μm. Further, respective widths of the intermediate n-type column region 3b, the uppermost n-type column region 3d, the intermediate p-type layer ring 15 and the uppermost p-type layer ring 14 may be from 6 μm to 14 μm and, for example, are 10 μm. Further, a ratio of a thickness of the upper parallel pn region 20c and a thickness of the center parallel pn region 20b is, for example, about 5:2 and a ratio of the thickness of the upper parallel pn region 20c and a thickness of the uppermost parallel pn region 20d is, for example, about 2:1.

The center parallel pn region 20b and the uppermost parallel pn region 20d may have repeat pitches that are about 2 times wider than repeat pitches of the lower parallel pn region 20a and the upper parallel pn region 20c. When the repeat pitches are 2 times wider, as depicted in FIG. 1, a p-type column region of an upper pn region (for example, the center parallel pn region 20b) and a p-type column region of a lower pn region (for example, the lower parallel pn region 20a) are periodically arranged, whereby equipotential lines enter equally to be most effective in improving breakdown voltage.

Further, the respective repeat pitches of the center parallel pn region 20b and the uppermost parallel pn region 20d may be constant. In other words, the interval between the uppermost p-type layer rings 14 and the interval between the intermediate p-type layer rings 15 may be constant inside (the active region 200) and outside (the termination region 300). For example, when the repeat pitch inside is decreased and the density of the uppermost p-type layer ring 14 or of the intermediate p-type layer ring 15 is increased, electric field may concentrate inside, decreasing the breakdown voltage. Therefore, in the embodiment, the repeat pitch is made constant, whereby equipotential lines are made uniform, portions that have high electric field are prevented from occurring locally, and the breakdown voltage of the termination region 300 is enhanced.

Further, as depicted in FIG. 2, the uppermost p-type layer ring 14 and the intermediate p-type layer ring 15 are provided at different positions along a lateral direction (direction parallel to the $n^+$-type semiconductor substrate 1, for example, a width direction of the n-type column regions and the p-type column regions of the parallel pn region 20). Therefore, in the center parallel pn region 20b and the uppermost parallel pn region 20d, positions of the p-type column regions along the lateral direction differ. Thus, in the parallel pn region 20, the n-type column regions, for example, the lower n-type column region 3a, the intermediate n-type column region 3b, the upper n-type column region 3c and, the uppermost n-type column region 3d are electrically connected to the $n^-$-type drift layer 2. In the parallel pn region 20 having a striped planar shape, in a region in which the width direction of the lower p-type column region 4a and the upper p-type column region 4c and the length direction of the intermediate p-type layer ring 15 and the uppermost p-type layer ring 14 become parallel, the p-type column regions, for example, the lower p-type column region 4a, the intermediate p-type layer ring 15, the upper p-type column region 4c and the uppermost p-type layer ring 14 are electrically connected. Further, since the positions of the p-type column regions in the lateral direction differ, depletion at a column of an oblique direction is suppressed, enabling the breakdown voltage to be improved. On the other hand, when the p-type column regions are provided at a same position, an extent to which breakdown voltage increases is decreased.

A position of the intermediate p-type layer ring 15 along a longitudinal direction (direction orthogonal to the $n^+$-type semiconductor substrate 1, for example, the length direction of the n-type column regions and the p-type column regions of the parallel pn region 19) may be about a center of the n-type column region 3 of the active region 200. Therefore, a thickness of the lower parallel pn region 20a is about a sum of respective thicknesses of the center parallel pn region 20b, the upper parallel pn region 20c and the uppermost parallel pn region 20d.

In this manner, the center parallel pn region 20b having a wide repeat pitch is provided in the parallel pn region 20 and the uppermost parallel pn region 20d having a wide repeat pitch is provided in a surface layer of the parallel pn region 20. For example, between the uppermost parallel pn region 20d and the center parallel pn region 20b, the upper parallel pn region 20c having a repeat pitch narrower than that of the center parallel pn region 20b and that of the uppermost parallel pn region 20d is arranged. As a result, an n-type impurity concentration at a portion of the uppermost parallel pn region 20d and the center parallel pn region 20b becomes lower than the conventional structure, depletion occurs at a lower voltage, and a higher breakdown voltage of the termination region 300 may be obtained.

Figure 3:
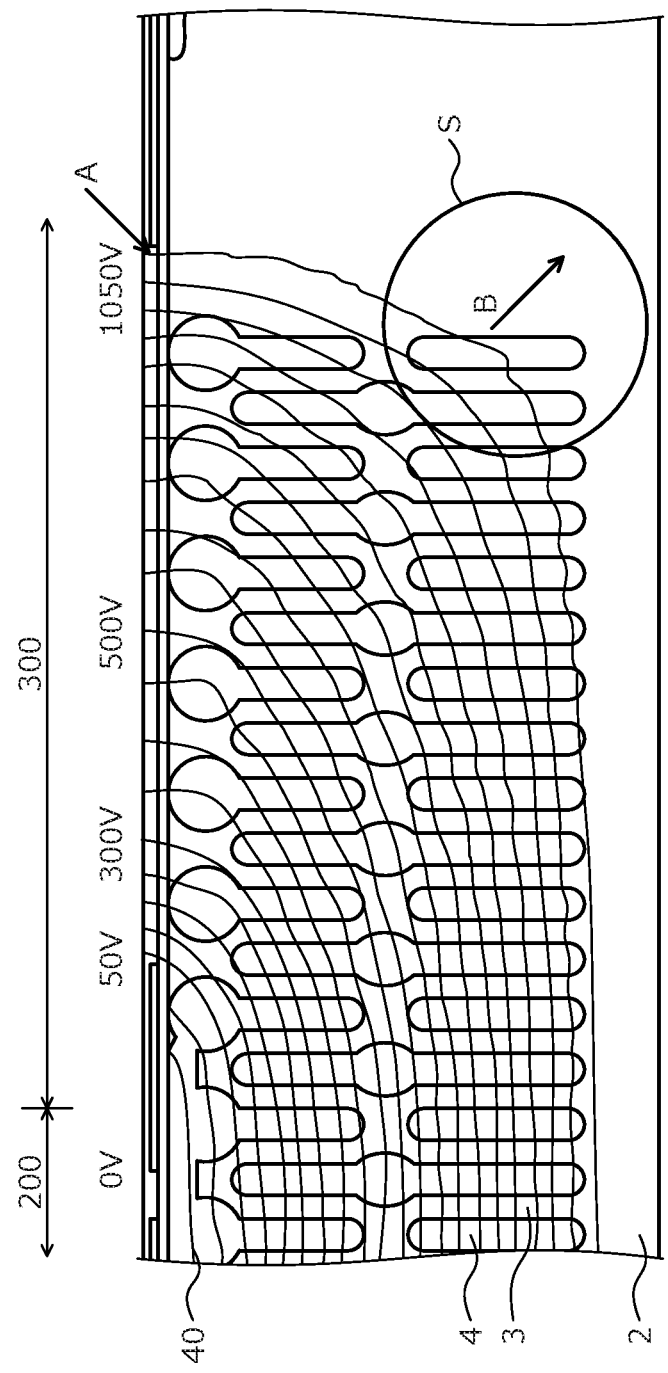
FIG. 3 is a cross-sectional view of equipotential lines of the SJ-MOSFET according to the embodiment.
Figure 4:
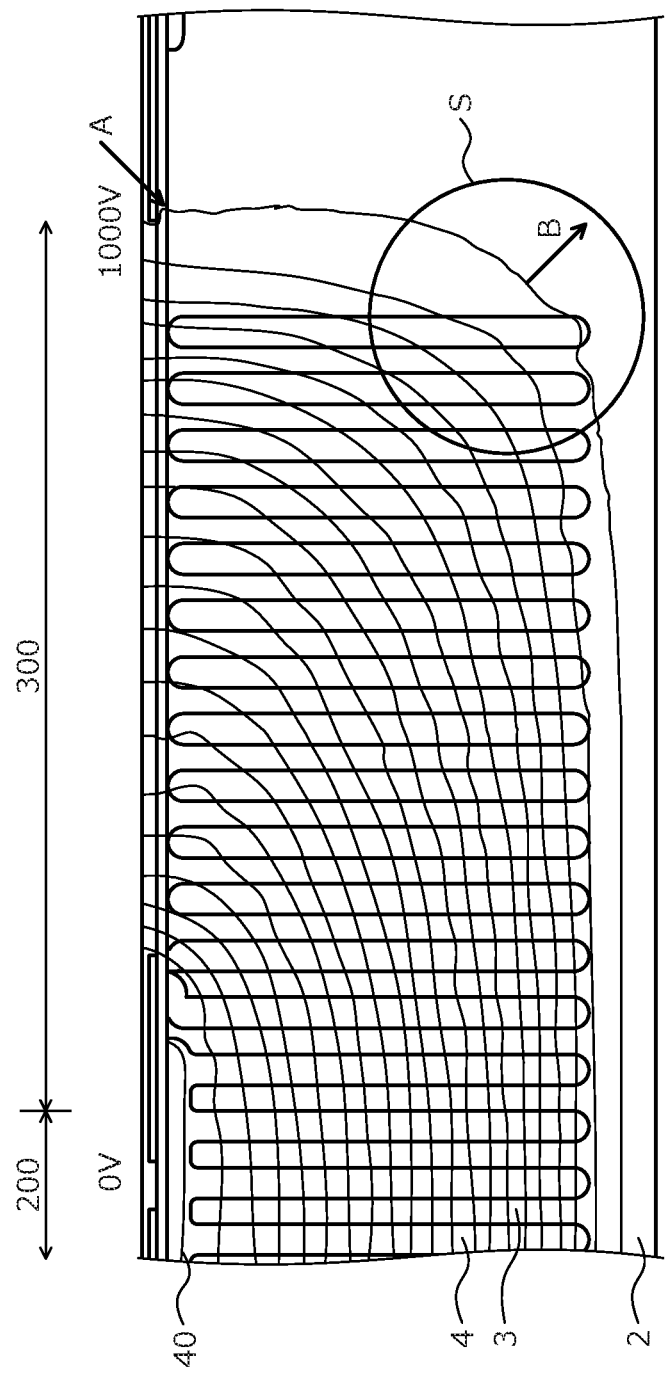
FIG. 4 is a cross-sectional view of equipotential lines a conventional SJ-MOSFET.

FIG. 3 is a cross-sectional view of equipotential lines of the SJ-MOSFET according to the embodiment. FIG. 4 is a cross-sectional view of equipotential lines the conventional SJ-MOSFET. Both FIGS. 3 and 4 depict equipotential lines 40 in a state in which a constant current flows in the SJ-MOSFETs having the termination regions 300, 1300 of a same length. As depicted in FIGS. 3 and 4, at a same position A in the termination regions 300, 1300, the equipotential line 40 of the SJ-MOSFET according to the embodiment is 1050V whereas the equipotential line 40 of the conventional SJ-MOSFET is 1000V.

Figure 5:
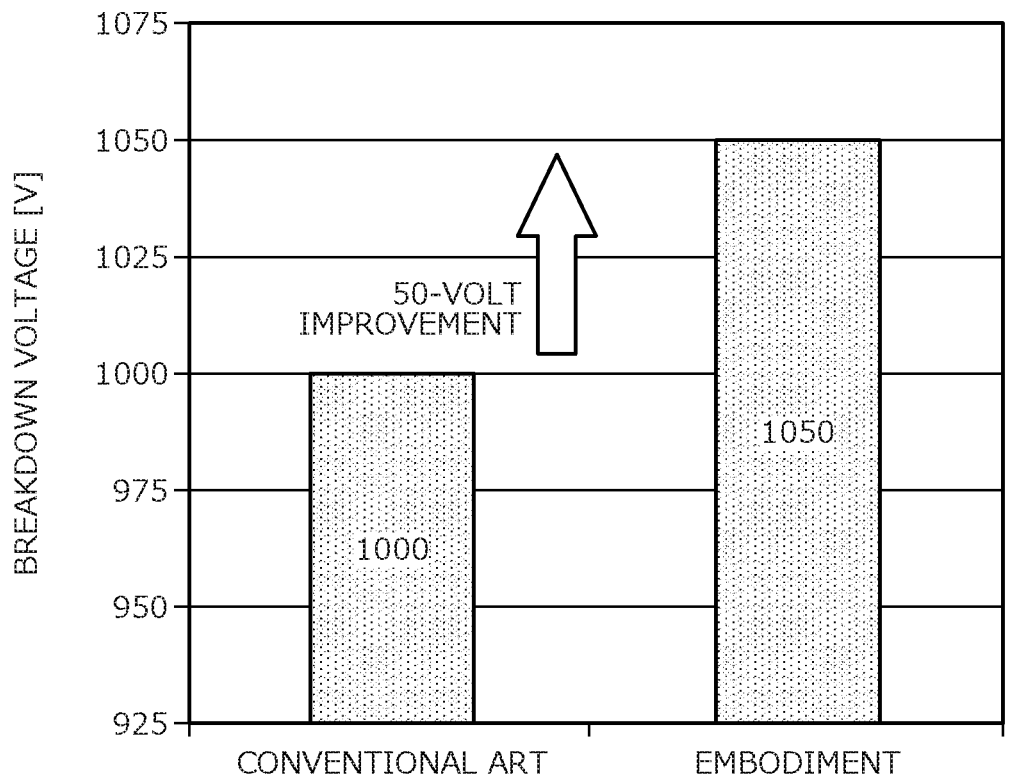
FIG. 5 is a graph comparing breakdown voltage of the SJ-MOSFET according to the embodiment and breakdown voltage of the conventional SJ-MOSFET.

FIG. 5 is a graph comparing breakdown voltage of the SJ-MOSFET according to the embodiment and breakdown voltage of the conventional SJ-MOSFET. In FIG. 5, a vertical axis represents breakdown voltage in units of V. As depicted in FIG. 5, the breakdown voltage of the SJ-MOSFET according to the embodiment is 50V higher than that of the conventional SJ-MOSFET. In this manner, the SJ-MOSFET according to the embodiment may improve breakdown voltage by about 50V for the termination region 300 of the same length as the termination region 1300. Further, when the same breakdown voltage is to be realized, the SJ-MOSFET according to the embodiment enables the length of the termination region 300 to be shorter than the length of the termination region 1300 of the conventional SJ-MOSFET.

A reason for this is as follows. In the conventional SJ-MOSFET, the depletion layer spreads in a lateral direction and thereafter, spreads in a depth direction. Therefore, a portion, a region S depicted in FIG. 4, does not contribute to improvement of the breakdown voltage. On the other hand, in the SJ-MOSFET according to the embodiment, the depletion layer does not spread easily through the center parallel pn region 20b and the uppermost parallel pn region 20d and therefore, the depletion layer spreads in the lateral direction and the depth direction concurrently, whereby the depletion layer spreads in square shape and the portion (the region S in FIG. 3) not used conventionally comes to contribute to improving the breakdown voltage. Thus, in the SJ-MOSFET according to the embodiment, the equipotential lines 40 do not overhang in a direction indicated by arrow B, whereby the density of the equipotential lines 40 increases. In this manner, in the SJ-MOSFET according to the embodiment, a portion not conventionally used contributes to the breakdown voltage, thereby increasing the density of the equipotential lines and enabling the breakdown voltage to be improved with the termination region 300 of the same length as that conventionally.

Further, in FIGS. 1 and 2, although the uppermost p-type layer ring 14 is provided farther outward (closer to the $n^+$-type region 12) than is the intermediate p-type layer ring 15, the intermediate p-type layer ring 15 may be provided farther outward.

Figure 6:
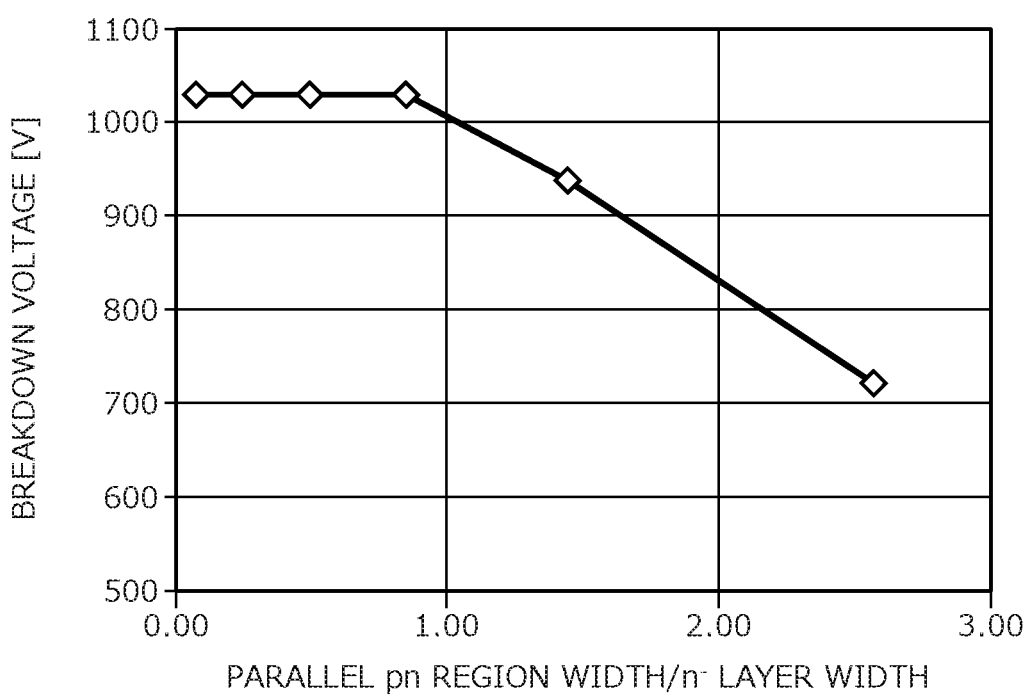
FIG. 6 is a graph depicting a relationship of breakdown voltage and parallel pn region width/$n^-$-type layer width.

FIG. 6 is a graph depicting a relationship of breakdown voltage and parallel pn region width/$n^-$-type layer width. In FIG. 6, a horizontal axis is a ratio of the width Wp of the parallel pn region 20 (refer to FIG. 1) to the width Wn of the n⁻-type layer 21 (refer to FIG. 1). A vertical axis is the breakdown voltage of the SJ-MOSFET in units of V. As depicted in FIG. 6, the breakdown voltage in the SJ-MOSFET is constant until the width Wp of the parallel pn region 20/the width Wn of the n⁻-type layer 21 exceeds a predetermined value and then, as the width Wn of the width Wp/n⁻-type layer 21 of the parallel pn region 20 increases, the breakdown voltage decreases. Therefore, when a breakdown voltage of 1000V or more is to be realized, the ratio of the width Wp of the parallel pn region 20/the width Wn of the n⁻-type layer 21 may be 0.2 to 0.8. Further, when a breakdown voltage of 600V or higher is to be realized, the ratio of the width Wp of the parallel pn region 20/the width Wn of n⁻-type layer 21 may be 2.0 or less.

A method of manufacturing the semiconductor device according to the embodiment will be described. FIGS. 7, 8, 9, 10, 11, 12, 13, 14, 15, and 16 are cross-sectional views of the SJ-MOSFET according to the embodiment during manufacture. First, the n⁺-type semiconductor substrate 1 containing silicon and constituting an n⁺-type drain layer is prepared. Next, on a front surface of the n+-type semiconductor substrate 1, the n⁻-type drift layer 2 having a lower impurity concentration than that of the n⁺-type semiconductor substrate 1 is formed by epitaxial growth.

Figure 7:
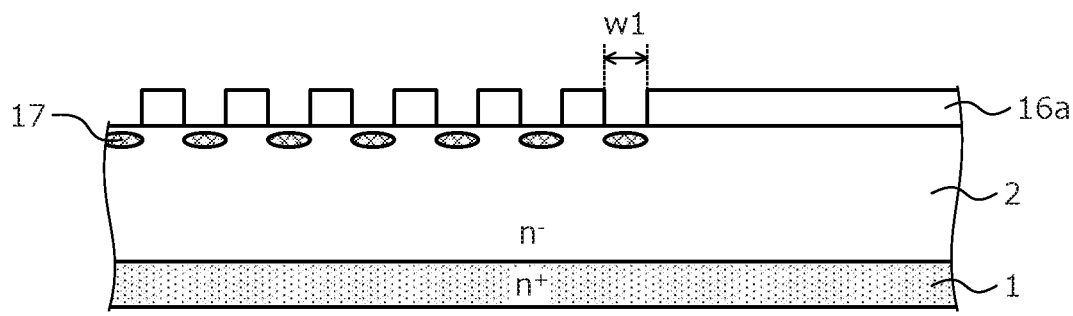
FIG. 7 is a cross-sectional view of the SJ-MOSFET according to the embodiment during manufacture.

Next, on the surface of the n⁻-type drift layer 2, by a photolithography technique, an ion implantation mask 16a having openings of a width w1 is formed using, for example, a photoresist. Ion implantation of a p-type impurity, for example, boron (B), is performed using the ion implantation mask 16a as a mask, forming p-type implanted regions 17 in the surface layer of the n⁻-type drift layer 2. The state up to here is depicted in FIG. 7. Next, the ion implantation mask 16a is removed.

Figure 8:
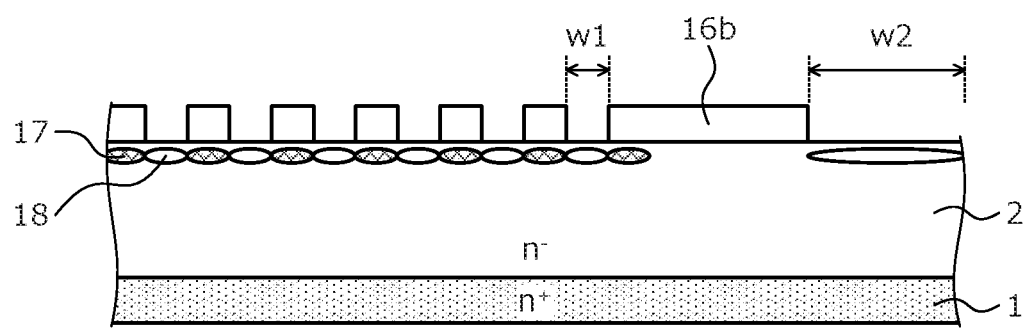
FIG. 8 is a cross-sectional view of the SJ-MOSFET according to the embodiment during manufacture.

Next, on the surface of the n⁻-type drift layer 2, by a photolithography technique, an ion implantation mask 16b having openings of the width w1 and openings of a width w2 is formed using, for example, a photoresist. An n-type impurity, for example, phosphorus (P), is ion implanted using the ion implantation mask 16b as a mask, forming n-type implanted regions 18 in a surface layer of the n⁻-type drift layer 2. The state up to here is depicted in FIG. 8. Next, the ion implantation mask 16b is removed.

Next, the n⁻-type layer 21 having an impurity concentration lower than that of the n⁻-type drift layer 2 is formed by epitaxial growth on a front surface side of the n⁻-type drift layer 2. At this time, for example, the epitaxial growth may be performed while an n-type impurity is doped so that an impurity concentration of the n⁻-type layer 21 becomes $1.0\times10^{12}/cm^3$ to $1.0\times10^{15}/cm^3$. The state up to here is depicted in FIG. 9.

Figure 9:
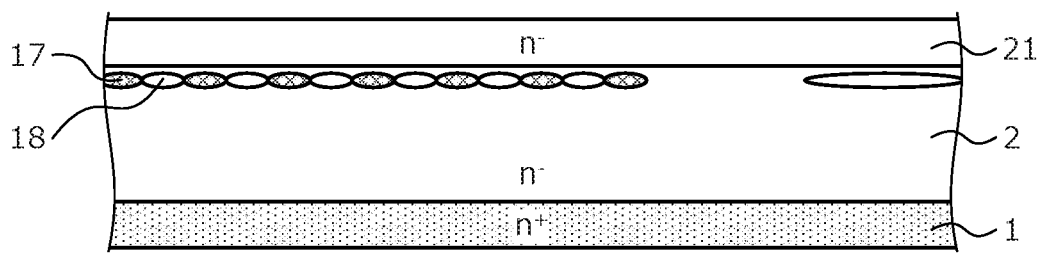
FIG. 9 is a cross-sectional view of the SJ-MOSFET according to the embodiment during manufacture.
Figure 10:
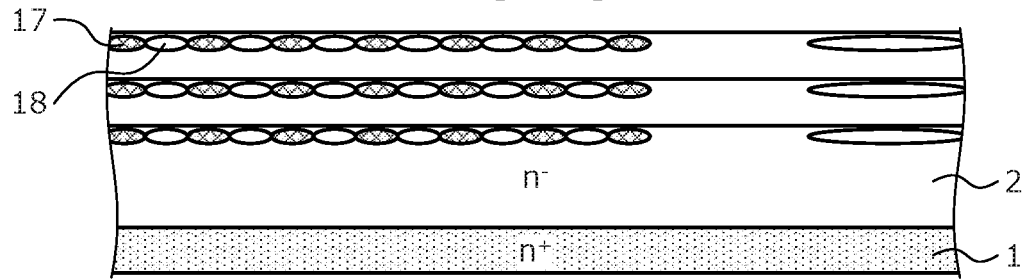
FIG. 10 is a cross-sectional view of the SJ-MOSFET according to the embodiment during manufacture.

Next, processes from the ion implantation to the epitaxial growth in FIGS. 7 to 9 are repeated until thicknesses of the p-type implanted regions 17 and the n-type implanted regions 18 become thicknesses of the lower n-type column regions 3a and the lower p-type column regions 4a. The state up to here is depicted in FIG. 10. In the example depicted in FIG. 10, although the ion implantation and the epitaxial growth are performed 3 times, without limitation hereto, the number of sessions of ion implantation and epitaxial growth may be suitably changed according to target characteristics such as breakdown voltage.

Other than the multiple ion implantations described, the lower n-type column regions 3a and the lower p-type column regions 4a may be formed by trenches. For example, on the front surface side of the n⁻-type drift layer 2, the n⁻-type layer 21 is formed by epitaxial growth until the thicknesses of the lower n-type column regions 3a and the lower p-type column regions 4a are obtained, trenches are formed at positions of the lower p-type column regions 4a, and a p-type impurity is epitaxially grown in the trenches.

Next, on a surface of the n⁻-type layer 21, the n⁻-type layer 21 is formed by epitaxial growth and has an impurity concentration lower than that of the n⁻-type drift layer 2. At this time, for example, the epitaxial growth may be performed by doping an n-type impurity so that the impurity concentration of the n⁻-type layer 21 becomes $1.0\times10^{11}/cm^3$ to $1.0\times10^{13}/cm^3$.

Figure 11:
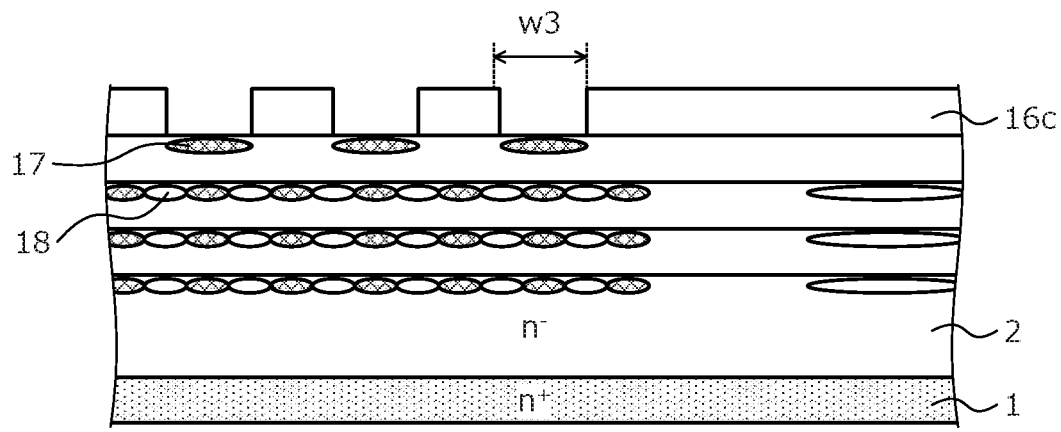
FIG. 11 is a cross-sectional view of the SJ-MOSFET according to the embodiment during manufacture.

Next, on a surface of the n⁻-type layer 21, by a photolithography technique, an ion implantation mask 16c having openings of a width w3 is formed using, for example, a photoresist. The width w3 is 1 to 1.2 times the width w1 and a pitch of a mask with openings of the width w3 is about 2 times a pitch of a mask with openings of the width w1. Here, a mask pitch is a length from one opening to a next opening. Ion implantation of a p-type impurity, for example, boron, using the ion implantation mask 16c is performed, forming the p-type implanted regions 17 in a surface layer of the n⁻-type layer 21. The state up to here is depicted in FIG. 11. Next, the ion implantation mask 16c is removed. In FIG. 11, although the processes from the epitaxial growth to the ion implantation are performed 1 time, thereby forming the p-type implanted region 17 corresponding to thicknesses of the intermediate p-type layer ring 15 and the intermediate n-type column region 3b, the processes from the epitaxial growth to the ion implantation may be performed plural times.

Figure 12:
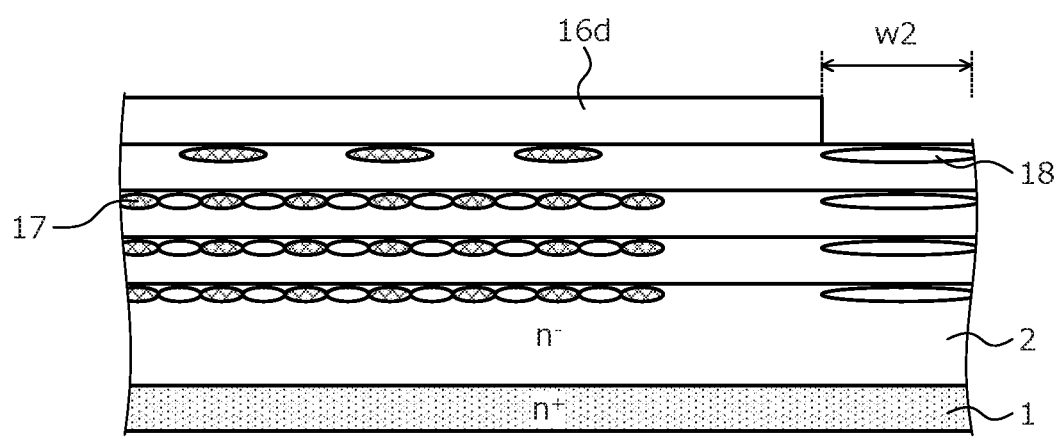
FIG. 12 is a cross-sectional view of the SJ-MOSFET according to the embodiment during manufacture.

Next, on the surface of the n⁻-type layer 21, by a photolithography technique, an ion implantation mask 16d having openings of the width w2 is formed using, for example, a photoresist. Ion implantation of an n-type impurity, for example, phosphorus is performed using the ion implantation mask 16d as a mask, forming the n-type implanted regions 18 in a surface layer of the n⁻-type layer 21. The state up to here is depicted in FIG. 12. Next, the ion implantation mask 16d is removed.

Figure 13:
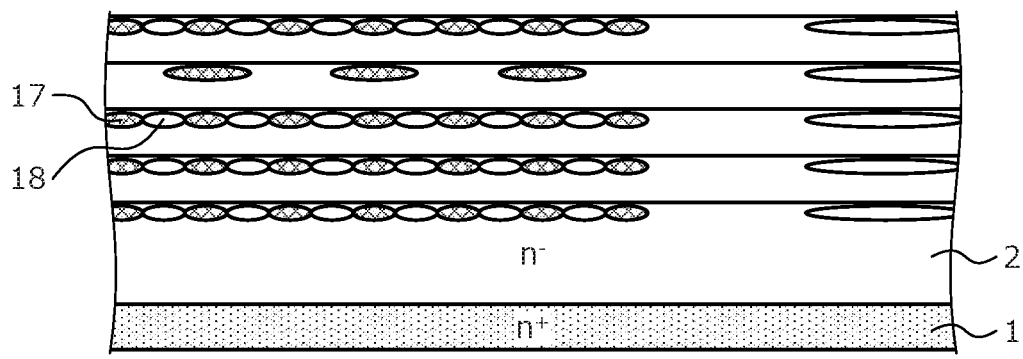
FIG. 13 is a cross-sectional view of the SJ-MOSFET according to the embodiment during manufacture.

Next, the processes from the ion implantation to the epitaxial growth in FIGS. 7 to 9 are repeated until thicknesses of the p-type implanted region 17 and the n-type implanted region 18 become thicknesses of the upper n-type column region 3c and the upper p-type column region 4c. The state up to here is depicted in FIG. 13. The example depicted in FIG. 13 is an example in which the ion implantation is performed 1 time.

Next, on a surface of the n⁻-type layer 21, the n⁻-type layer 21 having an impurity concentration lower than that of the n⁻-type drift layer 2 is formed by epitaxial growth. At this time, for example, the epitaxial growth may be performed by doping an n-type impurity so that the impurity concentration of the n⁻-type layer 21 becomes $1.0\times10^{12}/cm^3$ to $1.0\times10^{15}/cm^3$.

Figure 14:
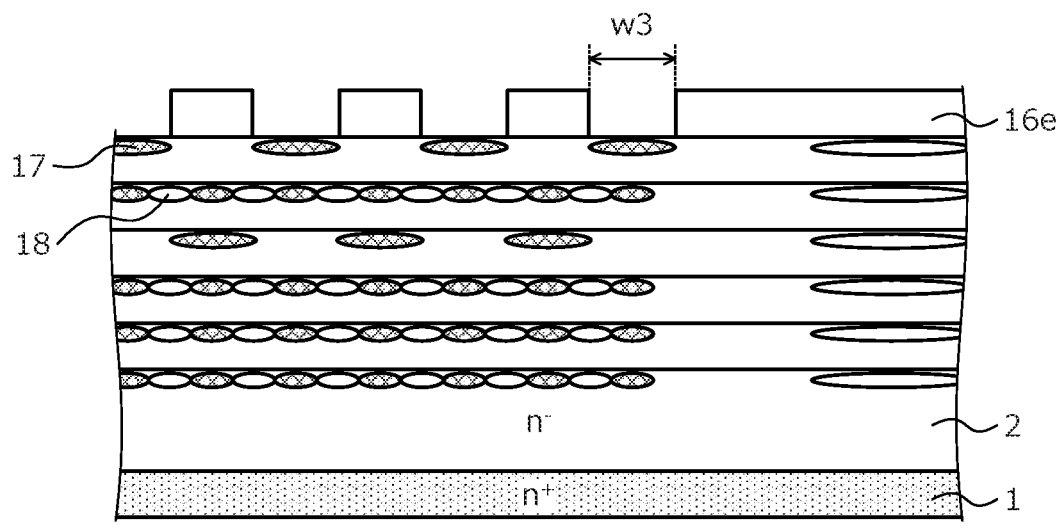
FIG. 14 is a cross-sectional view of the SJ-MOSFET according to the embodiment during manufacture.

Next, on a surface of the n⁻-type layer 21, by a photolithography technique, an ion implantation mask 16e having openings of the width w3 is formed using, for example, a photoresist. Here, positions of the openings of the ion implantation mask 16e are formed at positions different from the openings of the ion implantation mask 16c. Further, a mask pitch of the openings of the ion implantation mask 16e is equal to the mask pitch of the openings of the ion implantation mask 16c. Ion implantation of a p-type impurity, for example, boron is performed using the ion implantation mask 16e as a mask, forming the p-type implanted regions 17 in a surface layer of the n⁻-type layer 21. The state up to here is depicted in FIG. 14. Next, the ion implantation mask 16e is removed. In FIG. 14, although the processes from the epitaxial growth to the ion implantation are performed 1 time, forming the p-type implanted region 17 to the thicknesses of the uppermost p-type layer ring 14 and the uppermost n-type column region 3d, the processes from the epitaxial growth to the ion implantation may be performed plural times.

Figure 15:
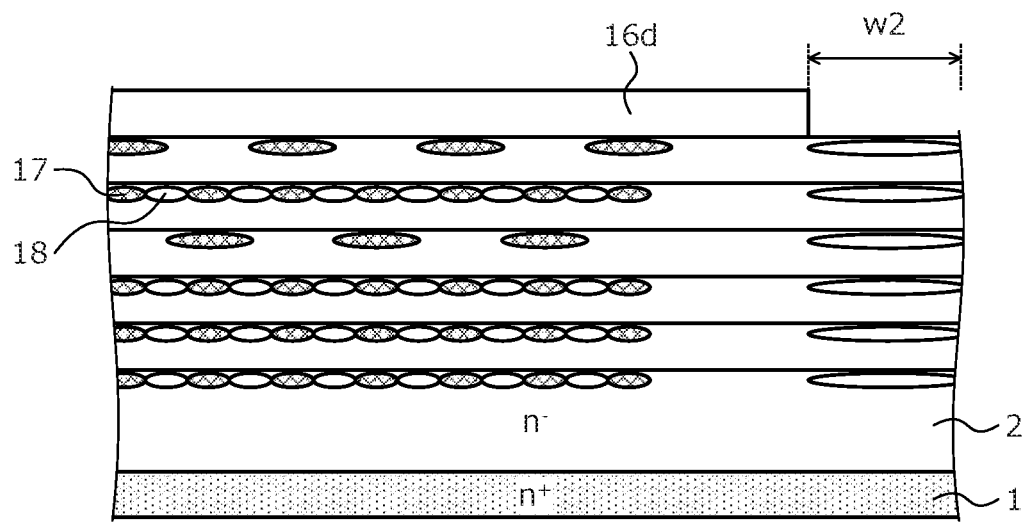
FIG. 15 is a cross-sectional view of the SJ-MOSFET according to the embodiment during manufacture.

Next, on a surface of the n$^-$-type layer 21, by a photolithography technique, the ion implantation mask 16d having openings of the width w2 is formed using, for example, a photoresist. Ion implantation of an n-type impurity, for example, phosphorus is performed using the ion implantation mask 16d as a mask, forming the n-type implanted regions 18 in a surface layer of the n$^-$-type layer 21. The state up to here is depicted in FIG. 15. Next, the ion implantation mask 16d is removed.

Figure 16:
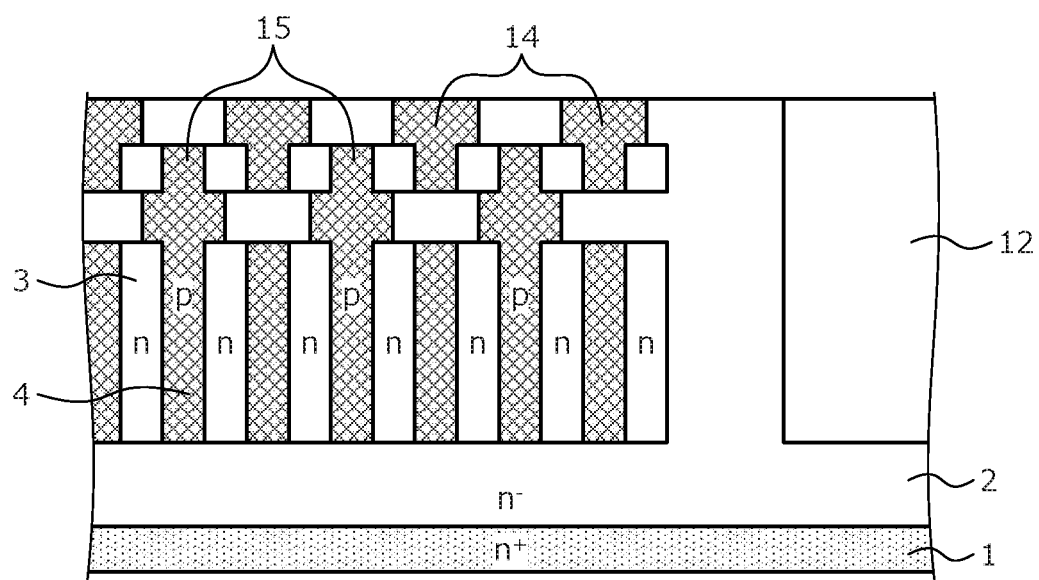
FIG. 16 is a cross-sectional view of the SJ-MOSFET according to the embodiment during manufacture.

Next, heat treatment (annealing) for activating the p-type implanted region 17 and the n-type implanted region 18 is performed. By this heat treatment, implanted impurities are diffused, and regions with the diffused impurities are connected along a longitudinal direction, whereby the n-type column regions 3, the p-type column regions 4, the n$^+$-type region 12, the uppermost p-type layer rings 14, and the intermediate p-type layer rings 15 are formed. Here, the width w3 for forming the uppermost p-type layer ring 14 and the intermediate p-type layer ring 15 is 1 to 1.2 times the width w1 for forming the n-type column region 3 and the p-type column region 4. The impurities diffuse by the heat treatment and therefore, a width of the uppermost p-type layer ring 14 and a width of the intermediate p-type layer ring 15 are 1.3 to 2.0 times the respective widths of the n-type column region 3 and the p-type column region 4. The state up to here is depicted in FIG. 16.

Thus, the parallel pn region 20 in the termination region 300 of SJ-MOSFET of the embodiment is formed. The parallel pn region 19 in the active region 200 may be formed by the multiple ion implantations depicted in FIGS. 7 to 9 or by trenches.

Next, on surfaces of the n-type column regions 3 and the p-type column regions 4 of the active region 200, by a photolithography technique, a mask having predetermined openings is formed using, for example, a resist. A p-type impurity is ion implanted using this resist mask as a mask, whereby in a part of a surface region of the n-type column regions 3 and a part of a surface region of the p-type column regions 4, the p$^+$-type base region 5 is formed. Next, the mask used at the time of the ion implantation for forming the p$^+$-type base regions 5 is removed.

Next, on a surface of the p$^+$-type base regions 5, by a photolithography technique, a mask having predetermined openings is formed using, for example, a resist. An n-type impurity is ion implanted using this resist mask as a mask, whereby in a part of a surface region of the p$^+$-type base regions 5, the n$^+$-type source region 6 is formed. Next, the mask used at the time of the ion implantation for forming the n$^+$-type source regions 6 is removed.

Next, heat treatment (annealing) for activating the p$^+$-type base regions 5 and the n$^+$-type source regions 6 is performed. Further, a sequence in which the p$^+$-type base region 5 and the n$^+$-type source region 6 are formed may be variously changed.

Next, the upper portion of the semiconductor base is subject to thermal oxidation, forming the gate insulating film 7 and the oxide film 13. As a result, regions formed at the surface of the n$^-$-type drift layer 2 in the active region 200 are covered by the gate insulating film 7.

Next, on the gate insulating film 7, as the gate electrode 8, a polycrystalline silicon layer doped with, for example, phosphorus is formed. The polycrystalline silicon layer is patterned and selectively removed, leaving the polycrystalline silicon layer on a portion of the p$^+$-type base region 5 between the n$^+$-type source region 6 and the n-type column region 3. At this time, the polycrystalline silicon layer may be left on the n-type column regions 3.

Next, for example, phosphorus glass (phosphosilicate glass (PSG)) is deposited as the interlayer insulating film 9 so as to cover the gate electrode 8. Next, the interlayer insulating film 9 and the gate insulating film 7 are patterned and selectively removed. For example, the gate insulating film 7 and the interlayer insulating film 9 on the n$^+$-type source regions 6 are removed, forming contact holes and exposing the n$^+$-type source regions 6. Next, heat treatment (reflow) for planarizing the interlayer insulating film 9 is performed.

Next, the source electrode 10 is deposited by sputtering and the source electrode 10 is patterned by photolithography and etching. At this time, the source electrode 10 is embedded in the contact holes and connected to the n$^+$-type source regions 6. In the contact holes, a tungsten plug, etc. may be embedded via a barrier metal.

Next, on a surface (rear surface of the semiconductor base) of the n$^+$-type semiconductor substrate 1, for example, a nickel film is deposited as the drain electrode (not depicted). Heat treatment is performed, forming an ohmic junction of the n$^+$-type semiconductor substrate 1 and the drain electrode. As a result, the MOSFET depicted in FIG. 1 is completed.

Further, in the termination region 300, a field plate, RESURF, guard ring structure, etc. may be provided.

Figure 17:
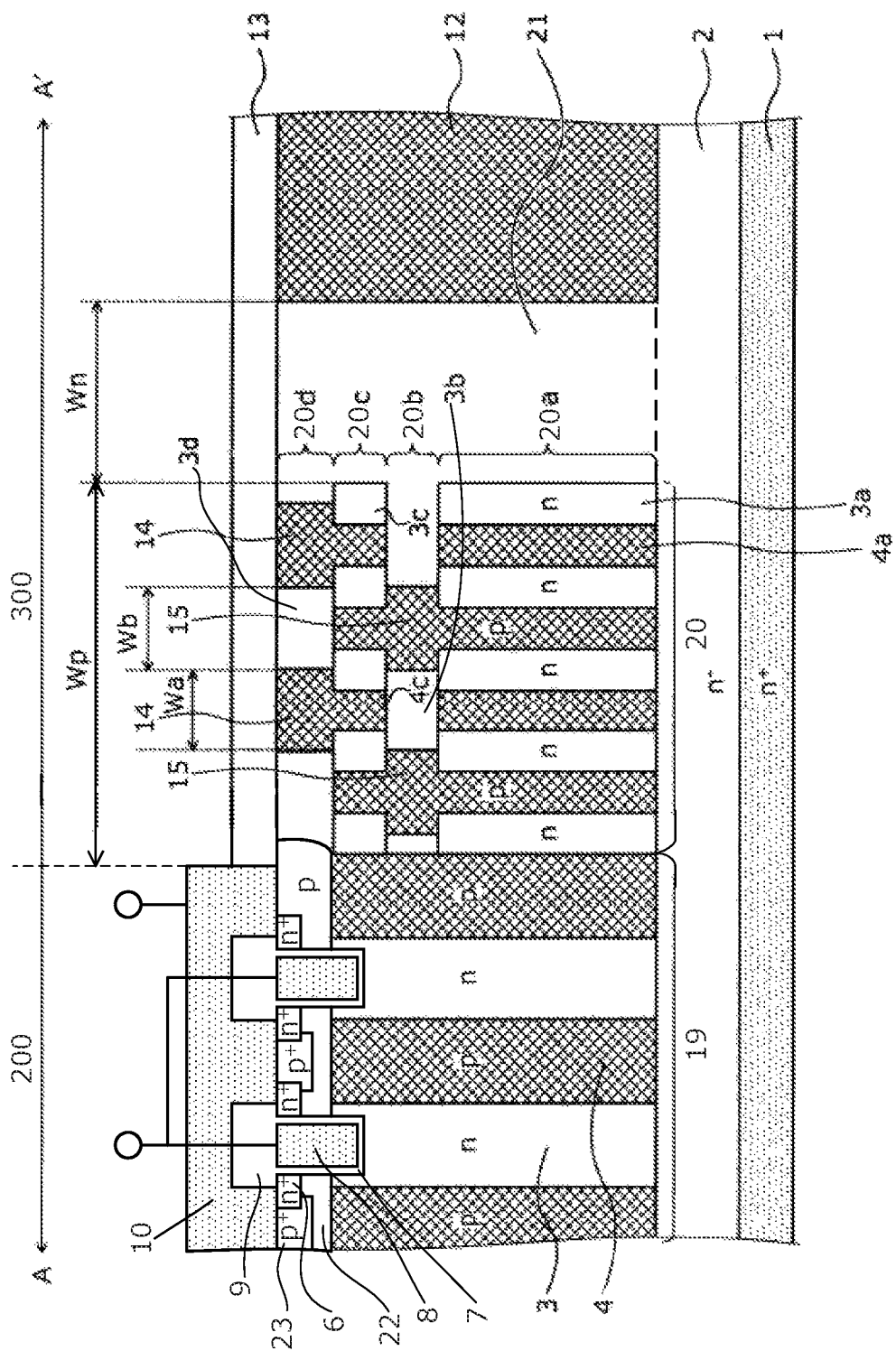
FIG. 17 is a cross-sectional view of another example of the structure of the SJ-MOSFET according to the embodiment, at cutting line A-A' in FIG. 2.
Figure 18:
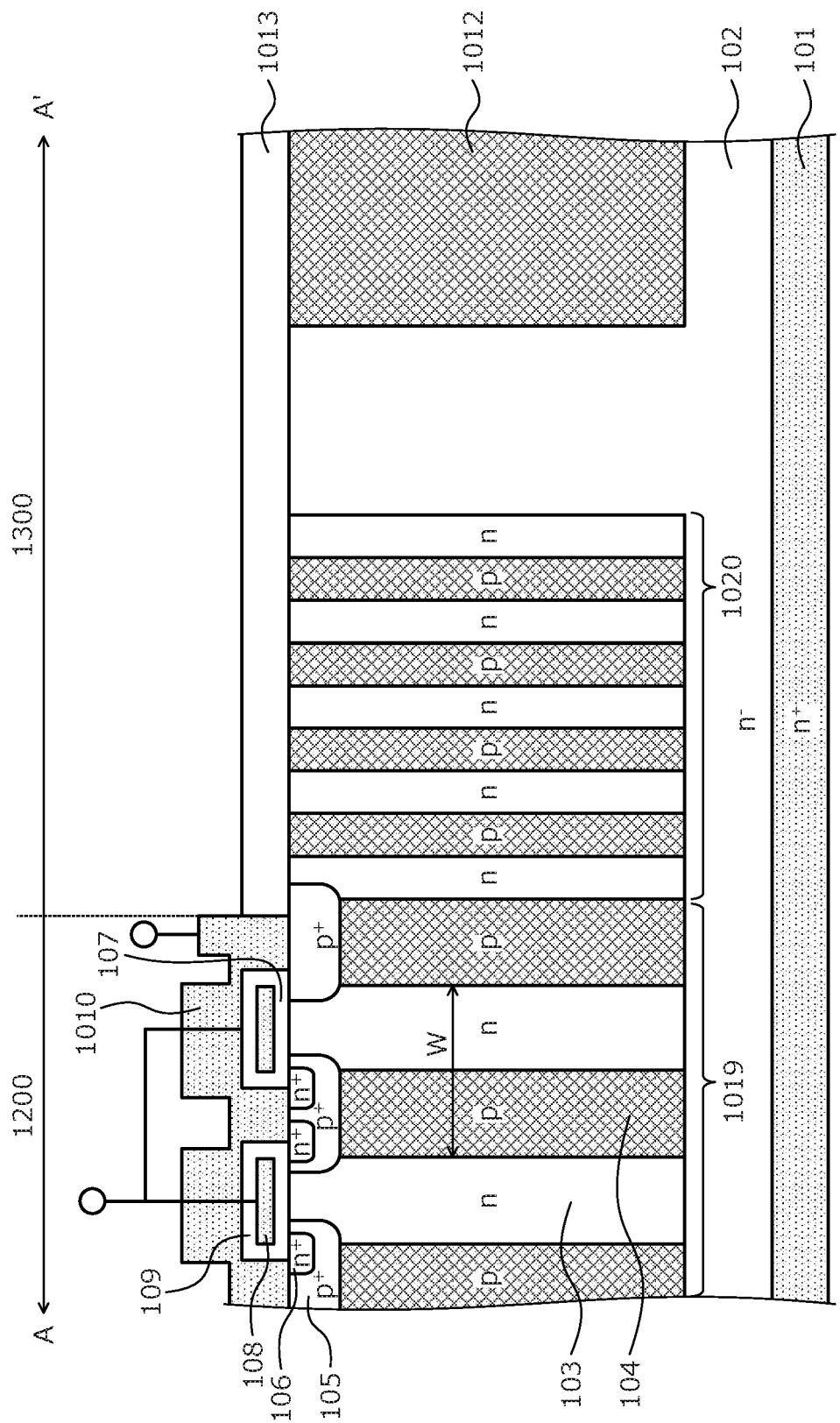
FIG. 18 is a cross-sectional view of a structure of the conventional SJ-MOSFET at cutting line A-A' in FIG. 19.
Figure 19:
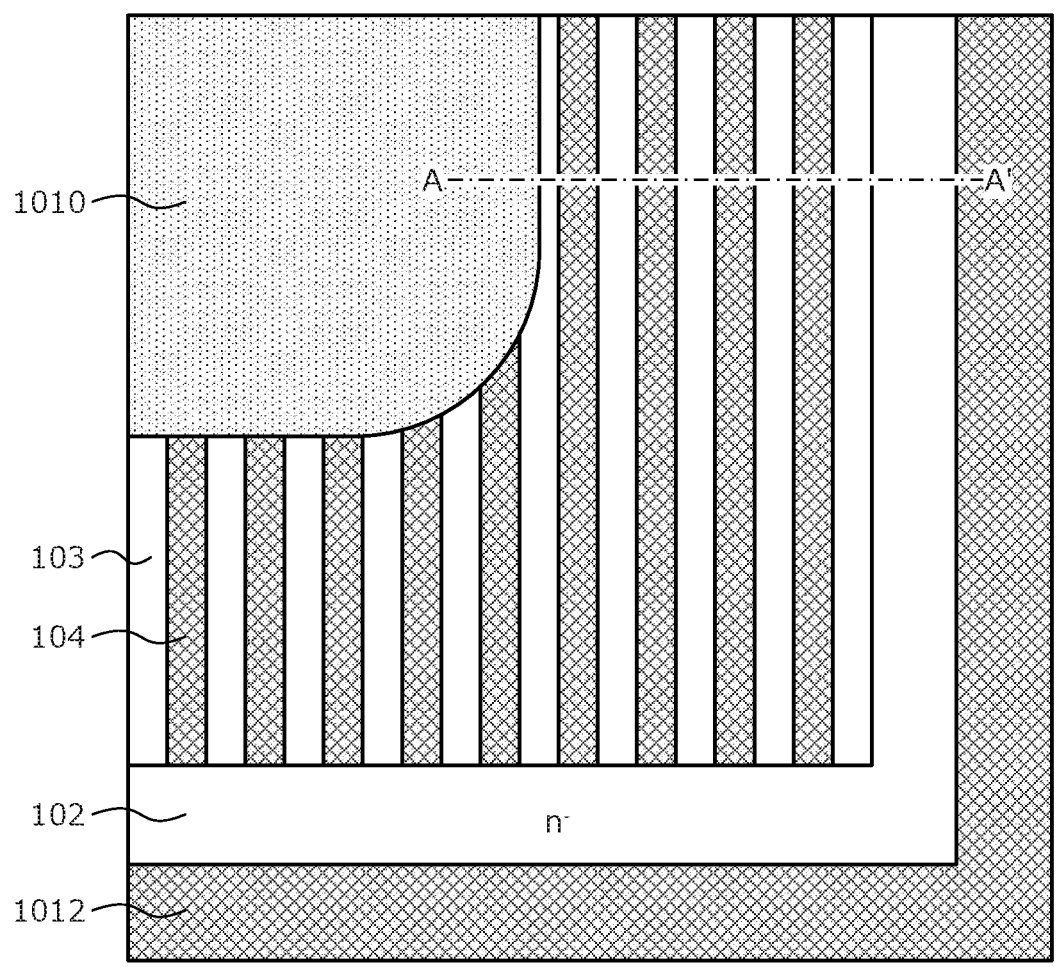
FIG. 19 is a top view of the structure of the conventional SJ-MOSFET.

FIG. 17 is a cross-sectional view of another example of the structure of the SJ-MOSFET according to the embodiment, at cutting line A-A' in FIG. 2. Different from FIG. 1, a gate electrode in the active region 200 has a trench gate structure. Further, the p$^+$-type base region 5 in FIG. 1 is a p-type base region 22. Further, between adjacent n$^+$-type source regions 6, a p$^+$-type contact region 23 is arranged. The n$^+$-type source region 6 and the p$^+$-type contact region 23 are electrically connected to the source electrode 10. Even when the gate electrode 8 of the parallel pn region 19 of the active region 200 has a trench gate structure, similar effects may be obtained.

As described, according to the embodiment, a center parallel pn region having a wide pitch is provided in a parallel pn region of the termination region and an uppermost parallel pn region having a wide pitch is provided in a surface layer of the parallel pn region. As a result, an n-type impurity concentration at a portion of the parallel pn region and a portion of the uppermost parallel pn region becomes lower than that in the conventional structure, depletion occurs at a lower voltage, and a semiconductor device having a higher breakdown voltage of the termination region that conventionally may be achieved.

In the embodiments of the present invention, although case in which a MOS gate structure is configured on a first main surface of a silicon substrate has been described as an example, without limitation hereto, various changes are possible such as a type of semiconductor material (for example, silicon carbide (SiC) or the like), orientation of the substrate main surface, etc. Further, in the embodiments of the present invention, although the first conductivity type is assumed to be an n-type and a second conductivity type is assumed to a p-type, the present invention is similarly implemented when the first conductivity type is a p-type and the second conductivity type is an n-type.

The semiconductor device and the method of manufacturing a semiconductor device of the embodiments according to the present invention achieve an effect in that without increasing the length of the termination region (without increasing a mathematical area of the termination region), the breakdown voltage of the termination region may be easily made higher than the breakdown voltage of the active region.

As described, the semiconductor device and the method of manufacturing a semiconductor device according to the present invention are useful for a high-voltage semiconductor device used in power converting equipment and in power supply devices of various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate of a first conductivity type, having a front surface;
   an active region through which current flows; and
   a termination structure region arranged outside the active region, the termination structure region having a breakdown voltage structure surrounding a periphery of the active region, the termination structure region including:
   a first semiconductor layer of the first conductivity type provided on the front surface, the first semiconductor layer having an upper surface and an impurity concentration lower than an impurity concentration of the semiconductor substrate; and
   a parallel pn structure provided at the upper surface of the first semiconductor layer, the parallel pn structure including:
      a lower parallel pn structure provided at the upper surface of the first semiconductor layer, the lower parallel pn structure having in a plane parallel to the front surface, a plurality of lower first columns of the first conductivity type and a plurality of lower second columns of a second conductivity type arranged alternating with the lower first columns,
      a center parallel pn structure provided on an upper surface of the lower parallel pn structure, the center parallel pn structure having in a plane parallel to the front surface, a plurality of center first columns of the first conductivity type and a plurality of first rings of the second conductivity type arranged surrounding the active region and alternating with the center first columns,
      an upper parallel pn structure provided on an upper surface of the center parallel pn structure, the upper parallel pn structure having in a plane parallel to the front surface, a plurality of upper first columns of the first conductivity type and a plurality of upper second columns of the second conductivity type arranged alternating with the upper first columns, and
      an uppermost parallel pn structure provided on an upper surface of the upper parallel pn structure, the uppermost parallel pn structure having in a plane parallel to the front surface, a plurality of uppermost first columns of the first conductivity type and a plurality of second rings of the second conductivity type arranged surrounding the active region and alternating with the uppermost first columns, wherein
   the first rings and the second rings each have a width greater than a width of the lower second columns, an interval between an adjacent two of the first rings and an interval between an adjacent two of the second rings being greater than an interval between an adjacent two of the lower second columns, and
   the first rings are nonoverlapping with the second rings in a plan view.

2. The semiconductor device according to claim 1, wherein the lower first columns, the center first columns, the upper first columns, and the uppermost first columns are electrically connected to one another.

3. The semiconductor device according to claim 1, wherein
   the termination structure region includes:
      a first semiconductor region of the first conductivity type, surrounding an outside of the parallel pn structure, and
      a second semiconductor region of the first conductivity type, surrounding an outside of the first semiconductor region,
   each lower first column and each lower second column in the lower parallel pn structure, each center first column and each first ring in the center parallel pn structure, each upper first column and each upper second column in the upper parallel pn structure and each uppermost first column and each second ring in the uppermost parallel pn structure respectively have a same width, and
   in the termination structure region, a ratio of a width of the parallel pn structure and a width of the first semiconductor region is in a range of 0.2 to 0.8.

4. The semiconductor device according to claim 1, wherein
   the width of each of the first rings and the width of the each second rings are 1.3 to 2 times the width of each of the upper second columns and the width of each of the lower second columns, and
   the interval between the adjacent two of the first rings and the interval between the adjacent two of the second rings are each 1.5 to 2 times the interval between the two adjacent lower second columns or the interval between the adjacent two of the upper second columns.

5. A method of manufacturing a semiconductor device having an active region through which current flows; and a termination structure region arranged outside the active region, the termination structure region having a breakdown voltage structure surrounding a periphery of the active region, the method comprising:
   forming a first semiconductor layer of a first conductivity type on a front surface of a semiconductor substrate of the first conductivity type, the first semiconductor layer having an impurity concentration lower than an impurity concentration of the semiconductor substrate;
   forming a lower parallel pn structure at an upper surface of the first semiconductor layer, the lower parallel pn structure having in a plane parallel to the front surface, a plurality of lower first columns of the first conductivity type and a plurality of lower second columns of a second conductivity type, the lower first columns being arranged alternately with the lower second columns;
   forming a center parallel pn structure on an upper surface of the lower parallel pn structure, the center parallel pn structure having in a plane parallel to the front surface, a plurality of center first columns of the first conductivity type and a plurality of first rings of the second conductivity type arranged surrounding the active region and alternating with the center first columns;

forming an upper parallel pn structure on an upper surface of the center parallel pn structure, the upper parallel pn structure having in a plane parallel to the front surface, a plurality of upper first columns of the first conductivity type and a plurality of upper second columns of the second conductivity type, the upper first columns being arranged alternately with the upper second columns; and forming an uppermost parallel pn structure on an upper side of the upper parallel pn structure, the uppermost parallel pn structure having in a plane parallel to the front surface, a plurality of uppermost first columns of the first conductivity type and a plurality of second rings of the second conductivity type arranged surrounding the active region and alternating with the uppermost first columns, wherein said forming a center parallel pn structure includes forming each of the first rings to have a width greater than a width of each of the lower second columns, and forming an interval between an adjacent two of the first rings to be greater than an interval between an adjacent two of the lower second columns, and said forming an uppermost parallel pn structure includes forming each of the first and second rings to have a same width, forming an interval between an adjacent two of the second rings to be equal to the interval between the adjacent two of the first rings, and forming the second rings to be nonoverlapping with the first rings in a plan view.

6. The method according to claim 5, wherein said forming a center parallel pn structure further includes using a mask having an opening of a width that is 1 to 1.2 times a width of an opening of a mask used in forming the lower parallel pn structure and forming the upper parallel pn structure, and said forming an uppermost parallel pn structure further includes using a mask having an opening of a width that is 1 to 1.2 times a width of an opening of a mask used in forming the lower parallel pn structure and forming the upper parallel pn structure.

* * * * *